United States Patent [19]
Johansen et al.

[11] Patent Number: 5,078,063
[45] Date of Patent: Jan. 7, 1992

[54] PRECISION MECHANICAL SQUEEGEE HOLDING ASSEMBLY

[75] Inventors: Scott W. Johansen, Barrington; Dirk D. McCoy, Batavia, both of Ill.

[73] Assignee: AG Communication Systems Corporation, Phoenix, Ariz.

[21] Appl. No.: 629,901

[22] Filed: Dec. 19, 1990

[51] Int. Cl.⁵ .............................................. B41F 15/46
[52] U.S. Cl. ................................... 101/480; 101/120; 101/123; 15/245; 403/374
[58] Field of Search ............... 101/119, 120, 123, 480, 101/365; 15/121, 245; 403/374; 299/24; 74/458, 424.7, 425

[56] References Cited

U.S. PATENT DOCUMENTS

| | | | |
|---|---|---|---|
| 1,514,491 | 11/1924 | Wildhaber | 74/458 |
| 1,922,710 | 8/1933 | Owens | 101/123 |
| 2,010,397 | 8/1935 | Joyce | 74/424.7 |
| 2,571,685 | 10/1951 | D'Autremont | 101/123 |
| 2,583,880 | 1/1952 | Premo | 403/374 |
| 2,739,530 | 3/1956 | McLaurin | 101/123 |
| 3,032,152 | 5/1962 | Titsler | 403/374 |
| 3,483,819 | 12/1969 | Hughes | 101/123 |
| 3,685,085 | 8/1972 | Jaffa | 15/245 |
| 3,901,146 | 8/1975 | Stierlein | 101/119 |
| 3,943,849 | 3/1976 | Vasilantone | 101/123 |
| 4,398,465 | 8/1983 | Pozin | 101/365 |
| 4,542,693 | 9/1985 | Mourrellone | 101/350 |
| 4,598,443 | 2/1986 | Östling et al. | 403/374 X |

Primary Examiner—Edgar S. Burr
Assistant Examiner—Eric P. Raciti
Attorney, Agent, or Firm—Anthony J. Baca

[57] ABSTRACT

An assembly for holding a squeegee blade provides a levelness control of the squeegee blade and a pressure control on the squeegee blade. The assembly includes a wedge having a length approximately equal to that of the squeegee blade. The wedge also has a right triangle shape along its longitudinal axis. The wedge is positioned between an upper stationary body and the squeegee blade. There is also a pressure adjustment for moving the wedge in either direction along its longitudinal axis, such that the motion of the wedge produces pressure on the squeegee blade; thus, providing the pressure control. The leveling control is accomplished by a micrometer attached to a rigid plate. The micrometer being rotatable along its longitudinal axis. A gear, which is attached to the upper stationary body, is rotatable about a pivot point on the ridged plate by the rotation of the micrometer.

3 Claims, 1 Drawing Sheet

5,078,063

PRECISION MECHANICAL SQUEEGEE HOLDING ASSEMBLY

FIELD OF THE INVENTION

The present invention relates in general to the screen printing process, and more particularly, a mechanical squeegee holding assembly use in the manufacturing process of; for example, screen printing printed circuits, thick film circuit, and solder masks.

BACKGROUND OF THE INVENTION

Prior to the present invention, two problems with controlling the rubber squeegee were prominent.

First, the means of holding the rubber squeegee in place was accomplished by five adjustable screws. These five screws would push into a flat piece of aluminum metal. Adjustment of the five screws continued until two conditions were met: (1) the rubber squeegee was held in place; and (2) the surface of the rubber blade was flat. While this mechanism worked, it had several disadvantages. Each time a new rubber blade was inserted into the holder and tightened in place the aluminum material deformed. The deformed aluminum distorted the squeegee blade producing uneven printing.

Second, the method of leveling the squeegee was imprecise. The leveling technique was accomplished by aligning the squeegee holder such that it was parallel with the printing surface. Once this was completed a screw was tightened in order to hold this position. Because the squeegee holder could move freely until it was tightened down, the very process of tightening tended to twist the squeegee holder. This twisting was cause by the torque generated by irregularities in the screw. Another means of performing the leveling function uses a spring and ratchet combination which provides a greater degree of control. However, this method is susceptible to spring fatigue over use.

SUMMARY OF THE INVENTION

In order to accomplish the object of the present invention there is provided an assembly for holding a squeegee blade, the assembly provides a levelness control of the squeegee blade and a pressure control on the squeegee blade.

The assembly includes a wedge having a length approximately equal to that of the squeegee blade. The wedge also has a right triangle shape along its longitudinal axis. The wedge is positioned between an upper stationary body and the squeegee blade.

There is also a pressure adjustment for moving the wedge in either direction along its longitudinal axis, such that the motion of the wedge produces pressure on the squeegee blade; thus, providing the pressure control.

The leveling control, is accomplished by a micrometer attached to a rigid plate. The micrometer being rotatable along its longitudinal axis. A gear, which is attached to the upper stationary body, is rotatable about a pivot point on the ridged plate by the rotation of the micrometer.

DESCRIPTION OF THE DRAWINGS

A better understanding of the invention may be had from the consideration of the following detailed description taken in conjunction with the accompanying drawings, in which.

DESCRIPTION OF THE PREFERRED EMBODIMENT

The screen printing process has been characterized by the industry as an imprecise science because of the interplay of variables in the process. Major components of the process are the printing mechanism, the material being printed, and the screen used to define the pattern being printed.

This invention provides a more precise method of controlling the printing mechanism's setup. The new mechanical squeegee holder is made from steel, providing additional mechanical strength to the device. The metal plate that mates with the rubber squeegee blade is ground flat. This device applies pressure to the blade by adjusting screws which move a wedge laterally, thereby moving the plate vertically. The wedge moves a flat steel plate until the squeegee blade is held in place. The mechanism applies pressure evenly across the entire surface of the rubber blade, preventing any bowing or waving of the blade from occurring.

The second major feature of the invention is that a leveling gear has been designed into the holder. This new leveling mechanism allows for very fine adjustments to the parallelism of the printing blade in relation to the surface being printed. A further advantage to this gear is that after the parallelism has been established, the gear will hold it in position while the locking screws can be tightened.

Figure 1:
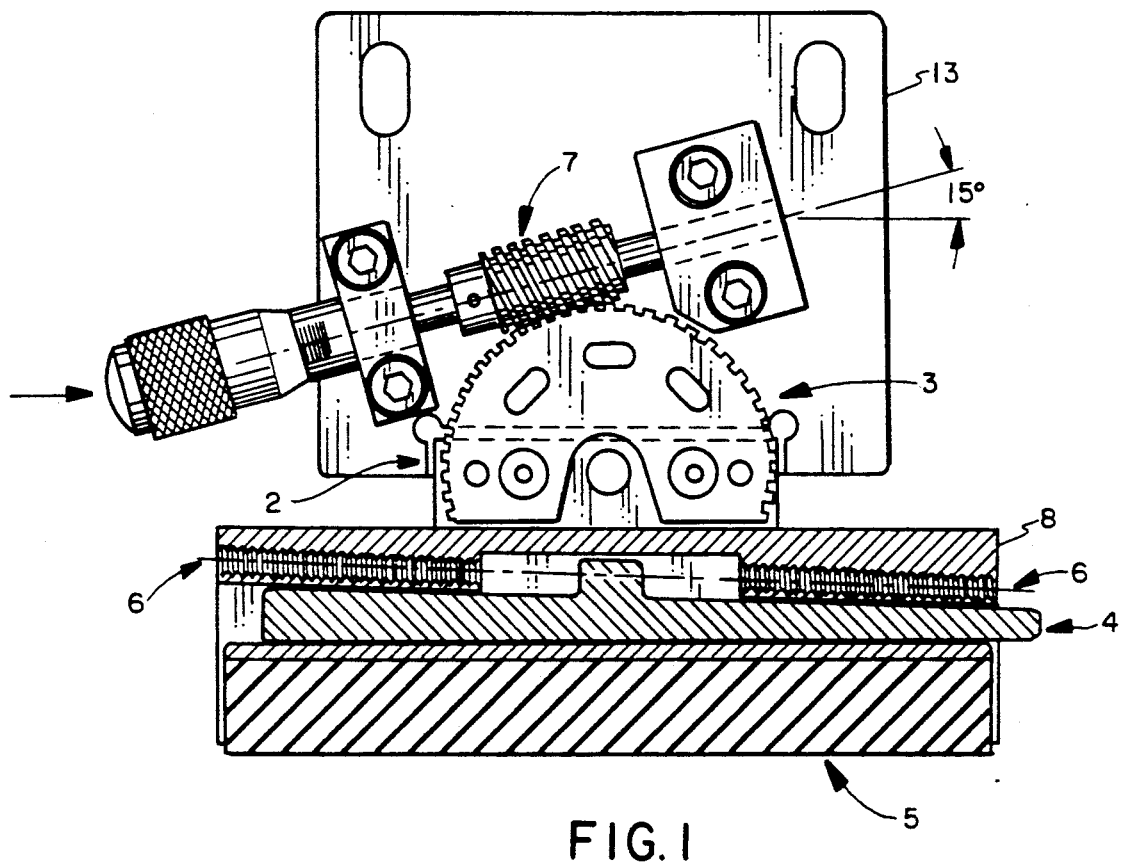
FIG. 1 is an assembly drawing of the precision mechanical squeegee holding assembly.

Referring to FIG. 1: The micrometer adjustment 1, squeegee lock down screw 2, and gear mechanism for parallelism 3 are shown. Micrometer adjustment 1 is attached to rigid holding plate 13 and rotates a screw type gear 7 which is linked to the gear mechanism 3. A rotation of micrometer adjustment 1 causes gear mechanism 3 to pivot because of the meshed teeth of screw type gear 7 and gear mechanism 3. This rotational action provides the operator with an accurate means of adjusting the squeegee assembly angle in relation to the printing surface. Once the parallelism has been established, the micrometer adjustment 1 holds gear mechanism 3 in position while the locking screws 2 can be tightened.

The pressure adjustment 4, located in the squeegee assembly 8 allows the operator to turn a set of screws (one screw in each direction is threaded through orifice 6) causing the wedge to move laterally. This lateral movement increases or decreases the pressure on the rubber squeegee blade 5. The adjustment is made until enough force is applied to the blade to hold it firmly in place. Once the adjustment is made, the two screws are tightened to hold pressure adjustment 4 in place. Because the wedge is applying force evenly across the entire printing blade, the blade cannot deform.

Figure 2:
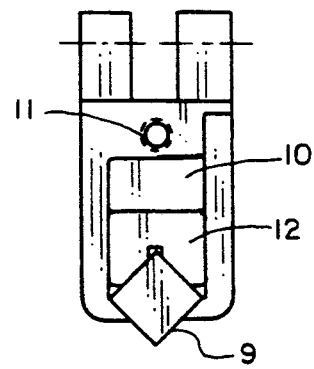
FIG. 2 is an assembly drawing of the squeegee assembly.

Referring briefly to FIG. 2, a side view of the squeegee assembly 8 of FIG. 1 is shown. Blade 9 is held in position by plate 12. The action of the screws (not shown) threaded through opening 11, causes pressure adjustment 10 to move laterally. As stated above this lateral movement causes a vertical movement in plate 12, thereby changing the pressure on blade 9.

Although the preferred embodiment of the invention has been illustrated, and that form described, it will be readily apparent to those skilled in the art that various modifications may be made therein without departing from the spirit of the invention or from the scope of the appended claims.

What is claimed is:

1. An assembly for holding a squeegee blade, said assembly providing a levelness control of said squeegee blade and pressure control on said squeegee blade, said assembly comprising:

a wedge means having a length approximately equal to that of said squeegee blade, said wedge means having a right triangle shape along its longitudinal axis, said wedge means being positioned between an upper stationary body and said squeegee blade;

a pressure adjustment means for moving said wedge means in either direction along its longitudinal axis, whereby said moving of said wedge means produces pressure on said squeegee blade, thereby providing said pressure control;

a rigid plate and a parallel adjustment means attached to said rigid plate, said parallel adjustment means being rotatable along its longitudinal axis; and a gear means being attached to said upper stationary body, said gear means being rotatable about a pivot point on said rigid plate by said rotation of said parallel adjustment means, whereby said rotation of said gear means provides said leveling control.

2. An assembly as claimed in claim 1, further comprising:

a locking means for stopping said gear means from further rotation once said leveling control has been adjusted.

3. An assembly for holding a squeegee blade, said assembly providing a pressure control on said squeegee blade, said assembly comprising:

a wedge means having a length approximately equal to that of said squeegee blade, said wedge means having a right triangle shape along its longitudinal axis, said wedge means being positioned between an upper stationary body and said squeegee blade; and a pressure adjustment means for moving said wedge means in either direction along its longitudinal axis, whereby said moving of said wedge means produces pressure on said squeegee blade, thereby providing said pressure control.

* * * * *